(12) United States Patent
Dong et al.

(10) Patent No.: US 9,388,055 B2
(45) Date of Patent: Jul. 12, 2016

(54) SILVER COMPOUND, SILVER INK AND METHOD FOR INKJET PRINTING ON FLEXIBLE SUBSTRATE USING THE SAME

(71) Applicant: National Sun Yat-sen University, Kaohsiung (TW)

(72) Inventors: Teng-yuan Dong, Kaohsiung (TW); Chen-Ni Chen, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 104 days.

(21) Appl. No.: 14/292,948

(22) Filed: Jun. 2, 2014

(65) Prior Publication Data

US 2015/0102272 A1    Apr. 16, 2015

(30) Foreign Application Priority Data

Oct. 16, 2013    (TW) .............................. 102137286 A

(51) Int. Cl.
| | | |
|---|---|---|
| *H01B 1/00* | (2006.01) | |
| *C01G 5/00* | (2006.01) | |
| *B05D 5/12* | (2006.01) | |
| *C09D 11/00* | (2014.01) | |
| *C09D 11/36* | (2014.01) | |
| *H01B 1/02* | (2006.01) | |
| *C09D 11/52* | (2014.01) | |
| *H01L 21/48* | (2006.01) | |

(52) U.S. Cl.
CPC *C01G 5/006* (2013.01); *B05D 5/12* (2013.01); *C09D 11/36* (2013.01); *C09D 11/52* (2013.01); *H01B 1/02* (2013.01); *H01L 21/4867* (2013.01)

(58) Field of Classification Search
CPC .............. H01B 1/00; H01B 1/02; C01G 5/00; C01G 5/006; C09D 11/36; H01L 21/288; H01L 21/4867; B05D 5/12
See application file for complete search history.

(56) References Cited

U.S. PATENT DOCUMENTS

| | | | | |
|---|---|---|---|---|
| 3,700,671 A | * | 10/1972 | D'Alelio | .................. B01J 45/00 525/375 |
| 5,998,528 A | | 12/1999 | Tsipursky et al. | |
| 6,613,924 B1 | * | 9/2003 | Welch | ..................... C07C 45/77 556/110 |
| 2007/0148460 A1 | | 6/2007 | Licht et al. | |
| 2007/0269991 A1 | * | 11/2007 | Jang | ........................ B82Y 15/00 438/778 |
| 2011/0020981 A1 | | 1/2011 | Mosley et al. | |
| 2011/0076799 A1 | * | 3/2011 | Calzia | .................. C09D 11/037 438/102 |

OTHER PUBLICATIONS

Solution-based β-diketonate silver ink for direct printing of highly conductive features on a flexible substrate, J. Mater. Chem. C, 2013,1, 5161.

* cited by examiner

*Primary Examiner* — Mark Kopec
(74) *Attorney, Agent, or Firm* — Soroker Agmon Nordman

(57) ABSTRACT

A silver compound having a silver complex structure composed of silver ion, 2,2,6,6-tetramethyl-3,5-heptanedionato, and diethylenetriamine is disclosed. A silver ink is prepared by the silver compound applied for inkjet printing of a flexible substrate. A method for inkjet printing of the flexible substrate comprises the steps of pre-heating the flexible substrate to the temperature of 60° C., inkjet printing the flexible substrate with the silver ink thereon, and heating the flexible substrate under a low temperature to form a thin film of silver conductive pattern thereon. The silver conductive pattern has excellent electrical conductivity and a resistance value proximate to that of a general silver slug.

12 Claims, No Drawings

SILVER COMPOUND, SILVER INK AND METHOD FOR INKJET PRINTING ON FLEXIBLE SUBSTRATE USING THE SAME

CROSS REFERENCE TO RELATED APPLICATIONS

This application claims the priority of Taiwan Patent Application No. 102137286, filed on Oct. 16, 2013. This invention is partly disclosed in a thesis entitled "Solution-based b-diketonate silver ink for direct printing of highly conductive features on a flexible substrate" on Jun. 26, 2013 completed by Chen-Ni Chen, Teng-Yuan Dong, Ting-Chang Chang, Min-Chen Chen, Ho-Lin Tsai, and Weng-Sing Hwang.

FIELD OF THE INVENTION

The present invention relates to a silver compound, and in particular it relates to a silver ink using a silver complex as the precursor and a method for inkjet printing on a flexible substrate using the same.

BACKGROUND OF THE INVENTION

In the manufacturing method of integrated circuits (ICs) in the past, the traditional process is electroplating and etching. Since the accompanied lithography requires complex and precise stacking of the conductive pattern to form a circuit, the costs and time consumed is high. Alternately, printing a conductive metal film directly on the substrate, and sinter heating to form a circuit pattern is a simple and low-cost manner. It therefore has potential for development.

Silver ink is often used in the inkjet printing process. In the prior art, a conductive silver is formed by reduction by heating at a high temperature, and is applied on the rigid silicon substrate. The silicon substrate has the disadvantage of inflexibility. However, when applied to the flexible substrate, the heat resistance of the flexible substrate is considered due to the temperature of the subsequent sintering to form the heating circuit. For example, the heat resistance of the polyimide (PI) substrate is between 250° C. and 300° C. according to the degree of polymerization.

In "Polyhedron 2002, 21, 1289-1297 and J. Mater Chem, 1999, 9, 1771-1780", it is proposed to use silver single-sided bonding 2,2,6,6-tetramethyl-3,5-heptanedionato (TMHD) or a complex having a similar structure, for example, 1,1,1,5,5, 5-Hexafluoroacetylacetone (HFAC). Such complexes can be used in chemical vapor deposition, which means that they have the characteristics of low-temperature pyrolysis. However, because HFAC contains functional groups of halogen fluoride, it is a toxic pollutant and not suitable for use under current environmental requirements. Further, the disadvantage in the prior art is the silver complex having large functional groups on the other end, thus making it difficult to cleave to measure the resistance or to have poor resistance.

Therefore, there is a need to provide a silver compound capable of cleavage at a low temperature to form a silver film having an excellent conductivity to solve the problems existing in conventional technologies, as described above.

SUMMARY OF THE INVENTION

The primary object of the present invention is to provide a silver compound made of silver-based ion 2,2,6,6-tetramethyl-3,5-heptanedionato and diethylenetriamine to form a silver complex. The silver compound is an environmentally friendly compound which is capable of cleavage at a low temperature, and suitable for use in the silver ink of inkjet printing.

The secondary object of the present invention is to provide a silver ink prepared by the above silver compound. The silver ions can be reduced to metallic silver in the low-temperature sintering to lower the cost and time consumed in the spray printing process used in large-sized electronic components, and form a conductive pattern having excellent conductivity.

To achieve the above object, the present invention provides a silver compound having the structure given in the following formula (I):

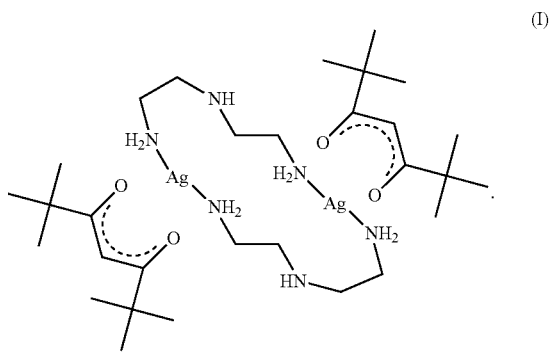

Furthermore, the present invention provides a silver ink for forming a conductive pattern on a flexible substrate, comprising the silver compound according to claim 1, n-hexylamine, and a thickener.

In one embodiment of the present invention, the thickener is ethyl cellulose.

In one embodiment of the present invention, the silver ink is applied on the flexible substrate by spin-coating.

In one embodiment of the present invention, the weight ratio of the silver compounds, n-hexylamine, and the thickener is 60:39:1.

In one embodiment of the present invention, the silver ink is applied on the flexible substrate by spraying.

In one embodiment of the present invention, the weight ratio of the silver compounds, n-hexylamine, and the thickener is 45:54:1.

In one embodiment of the present invention, the material of the flexible substrate is selected from polyimide, polyether sulfone, polyethylene terephthalate, or flexible foil.

Furthermore, the present invention provides a method for inkjet printing on a flexible substrate, which comprises the steps of heating the flexible substrate to 60° C., inkjet printing the abovementioned silver ink to form a conductive pattern on the flexible substrate, and heating the flexible substrate again in the air to a predetermined temperature, so that the silver compound is reduced to form a thin film of silver conductive pattern.

In one embodiment of the present invention, the material of the flexible substrate is selected from polyimide, polyethersulfone, polyethylene terephthalate, or flexible foil.

In one embodiment of the present invention, the predetermined temperature is between 150 and 250° C.

In one embodiment of the present invention, the silver ink is applied on the flexible substrate by spin-coating or piezo inkjet printing.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

The first embodiment of the present invention provides a silver compound having its main structure as given in the following formula (I):

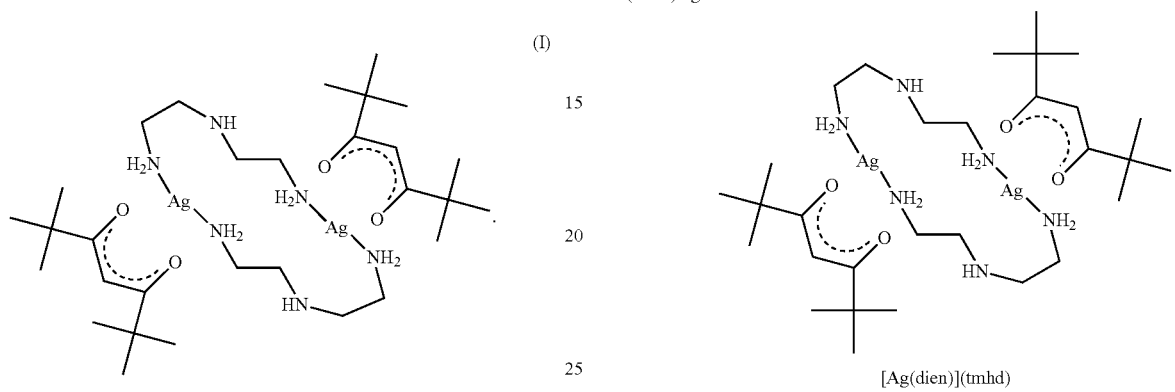

(I)

The above formula (I) shows the silver complex [Ag(DIEN)](TMHD) which is made of silver ions (Ag$^+$), 2,2,6,6-tetramethyl-3,5-heptanedionate (TMHD), and diethylenetriamine (DIEN). The silver compound [Ag(DIEN)](TMHD) according to an embodiment of the present invention has a ligand which is capable of cleavage at a low temperature. A silver film is then formed by heating the silver compound and it has excellent electrical conductivity, 4.62× 10$^{-6}$ Ωcm, via electrical measurement. If the reduced silver is applied by the printing process to form a silver film, the conductivity thereof is 7.44×10$^{-6}$ Ωcm. The silver film thus has excellent electrical conductivity and a resistance value proximate to that of a general silver slug.

Furthermore, the silver compound [Ag(DIEN)](TMHD) of the present invention is prepared by the following synthesis process.

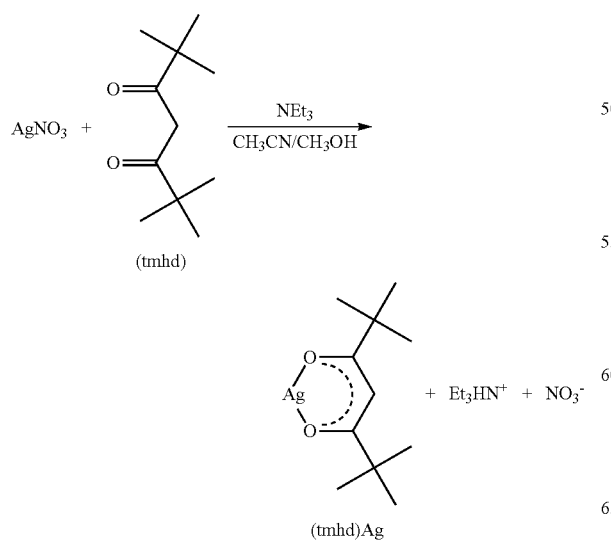

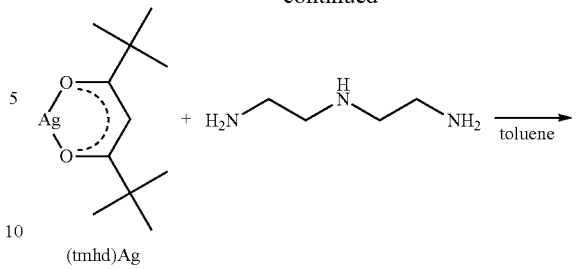

(tmhd)Ag

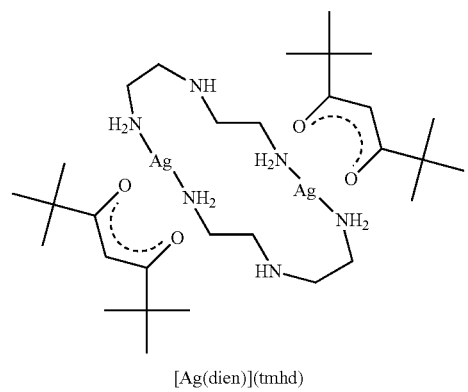

[Ag(dien)](tmhd)

In one embodiment of the present invention, 3.36 g (20 mmol) of silver nitrate were dissolved in a mixed solvent of 1.12 mL of acetonitrile and 20 mL of methanol, and the mixture is maintained at 0° C. in an ice bath, then the pre-mixed solution of 4.4 mL (20 mmol) of TMHD ligand/2.8 mL (20 mmol) of triethylamine/20 mL of methanol is added. The reaction is taken at 0° C. and stirred in the ice bath for 30 minutes, then the product is filtered by rapid suction filtration to obtain a white solid of Ag (TMHD). The solvent of the obtained white solid is removed by pumping, and the dried solid is weighed and stored in a three-necked flask filled with nitrogen. Next, 20 mL of toluene is injected into the flask at 0° C. in an ice bath and stirred, and an equal number of equivalents of the liquid DIEN is mixed therein and stirred for one hour. The excess solvent is removed in vacuum to obtain a white solid which is the silver compound, [Ag(DIEN)](TMHD), and the yield is about 88%.

The second embodiment of the present invention provides a silver ink, which comprises the silver compound having a structure as shown in formula (I), n-hexylamine, and a thickener.

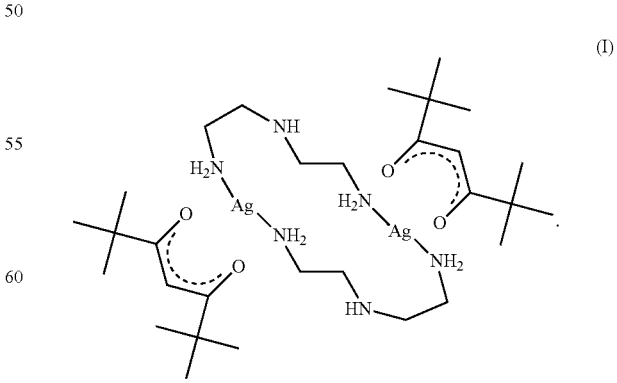

(I)

n-hexyl amine is used as an organic solvent which allows the large amount of the silver compound which is soluble therein to enhance the concentration of the silver in the printing process. Furthermore, the thickener added in the silver ink according to the second embodiment of the present invention is, for example, ethyl cellulose for adjusting the viscosity of the silver ink in order to facilitate the best spray properties of the printing machine.

According to the silver ink of the second embodiment of the present invention, it is preferably applied to a method for inkjet printing a circuit on a flexible substrate. The flexible substrate may be, for example, an ultra-thin glass substrate, a metal substrate, or a plastic substrate. The material of the plastic substrate which is most commonly used in semiconductor and electronic components may be, for example, polyimide (PI), polyethersulfone (PES) or polyethylene terephthalate (PET), etc. The material of the metal substrate may, for example, be a flexible foil. The silver ink is applied on the flexible substrate by spin coating, when the silver ink is used as the spin coating recipe, the weight ratio of the silver compound, n-hexylamine, and the thickener is 60:39:1. If the silver ink is applied on the flexible substrate by spraying, the weight ratio of the silver compound, n-hexylamine, and the thichener is 45:54:1.

The third embodiment of the present invention provides a method for inkjet printing on a flexible substrate, which generally comprises the steps of (S1) the flexible substrate is heated to 60° C.; (S2) inkjet printing the silver ink according to the abovementioned second embodiment to form a conductive pattern on the flexible substrate; and (S3) heating the flexible substrate in the air to a predetermined temperature so that the silver compound is reduced to form a thin film of silver conductive pattern.

In this embodiment, the silver ink comprises the silver compound having a structure as shown in formula (I), n-hexylamine, and a thickener.

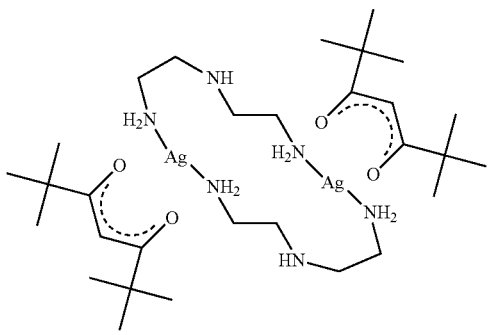

(I)

Furthermore, in step (S1), the flexible substrate is heated prior to the printing step such that the coffee ring effect of the silver ink can be reduced to form a more uniform conductive pattern, and the conductivity is $7.44 \times 10^{-6}$ Ωcm, which has good electrical conductivity and a resistance value proximate to that of a general silver slug. The material of the flexible substrate may be, for example, polyimide, polyethersulfone, polyethylene terephthalate, or flexible foil. The predetermined temperature is between 150 and 250° C., for example 200° C. or 230° C., and is not limited thereto. The silver ink can be applied on the flexible substrate by spin-coating or piezo inkjet printing. The conductive pattern can be any shape of the circuit layout.

In accordance with the silver compound, the silver ink and the method for inkjet printing on a flexible substrate provided by the present invention, the silver ink has a resistance value proximate to that of a general silver slug after heat treatment and is able to lower the sintering temperature of the circuit and improve the reliability when being applied to the printing process of the flexible substrate. In addition, obtaining a metallic pattern having excellent conductivity in a low-temperature heating manner overcomes the limitation of the high-temperature reduction performed on the flexible substrate and is a convenient, fast, and low-cost method that eliminates the time spent for the etching process and reduces pollution from a variety of chemicals. The method can be applied to a very wide range of products, comprising all the products having a conductive circuit. Further, the silver component, the silver ink, and the method of inkjet printing can also be applied to repair minor defects in the circuit of the wafer, so that the defective rate can be reduced.

The present invention has been described with preferred embodiments thereof and it is understood that many changes and modifications to the described embodiments can be carried out without departing from the scope and the spirit of the invention that is intended to be limited only by the appended claims.

What is claimed is:

1. A silver compound having the structure given in the following formula (I):

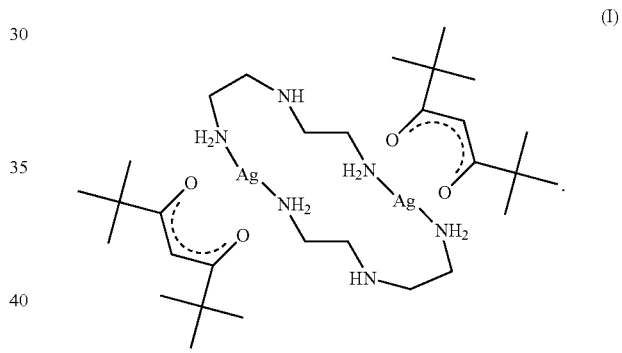

(I)

2. A silver ink for forming a conductive pattern on a flexible substrate, comprising the silver compound according to claim 1, n-hexylamine, and a thickener.

3. The silver ink according to claim 2, wherein the thickener is ethyl cellulose.

4. The silver ink according to claim 2, wherein the silver ink is applied on the flexible substrate by spin-coating.

5. The silver ink according to claim 4, wherein the weight ratio respectively of the silver compounds, n-hexylamine, and the thickener is 60:39:1.

6. The silver ink according to claim 2, wherein the silver ink is applied on the flexible substrate by spraying.

7. The silver ink according to claim 6, wherein the weight ratio respectively of the silver compounds, n-hexylamine, and the thickener is 45:54:1.

8. The silver in according to claim 2, wherein the material of the flexible substrate is selected from the group consisting of polyimide, polyether sulfone, polyethylene terephthalate, and flexible foil.

9. A method for inkjet printing, on a flexible substrate, comprising the steps of:
heating the flexible substrate to 60° C.;
inkjet printing the silver ink according to claim 2 to form a conductive pattern on the flexible substrate; and heating the flexible substrate in the air to a predetermined temperature so that the silver compound is reduced to form a thin film of silver conductive pattern.

10. The method according to claim 9, wherein the material of the flexible substrate is selected from the group consisting of polyimide, polyethersulfone, polyethylene terephthalate, and flexible foil.

11. The method according to claim 9, wherein the predetermined temperature is between 150 and 250° C.

12. The method according to claim 9, wherein the silver ink is applied on the flexible substrate by spin-coating or piezo inkjet printing.

* * * * *